United States Patent [19]
Ueda et al.

[11] Patent Number: 6,013,922
[45] Date of Patent: Jan. 11, 2000

[54] SEMICONDUCTOR STORAGE ELEMENT HAVING A CHANNEL REGION FORMED OF AN AGGREGATE OF SPHERICAL GRAINS AND A METHOD OF MANUFACTURING THE SAME

[75] Inventors: Tohru Ueda; Kenta Nakamura, both of Fukuyama; Yasumori Fukushima, Sakurai, all of Japan

[73] Assignee: Sharp Kabushiki Kaisha, Osaka, Japan

[21] Appl. No.: 09/085,020

[22] Filed: May 28, 1998

[51] Int. Cl.[7] .......................... H01L 29/66; H01L 29/167; H01L 29/207; H01L 29/227

[52] U.S. Cl. .................................. 257/57; 257/64; 257/66

[58] Field of Search .................................. 257/52, 57, 64, 257/66

[56] References Cited

U.S. PATENT DOCUMENTS 4,107,724  8/1978  Ralph .

*Primary Examiner*—Stephen D. Meier
*Attorney, Agent, or Firm*—Nixon & Vanderhye, P.C.

[57] ABSTRACT

A semiconductor storage element has a source region, a drain region, and a channel region connecting the source region with the drain region, which each are formed on an insulation film of a substrate. A gate insulation film is formed between the channel region and a gate electrode. The source region, the drain region, and the channel region consist of an aggregate of spherical grains which are arranged two-dimensionally on the insulation film and connected with one another such that the adjacent spherical grains are conductive to one another. The channel region contains at least one carrier trap region provided at a location other than an electric path thereof.

3 Claims, 6 Drawing Sheets

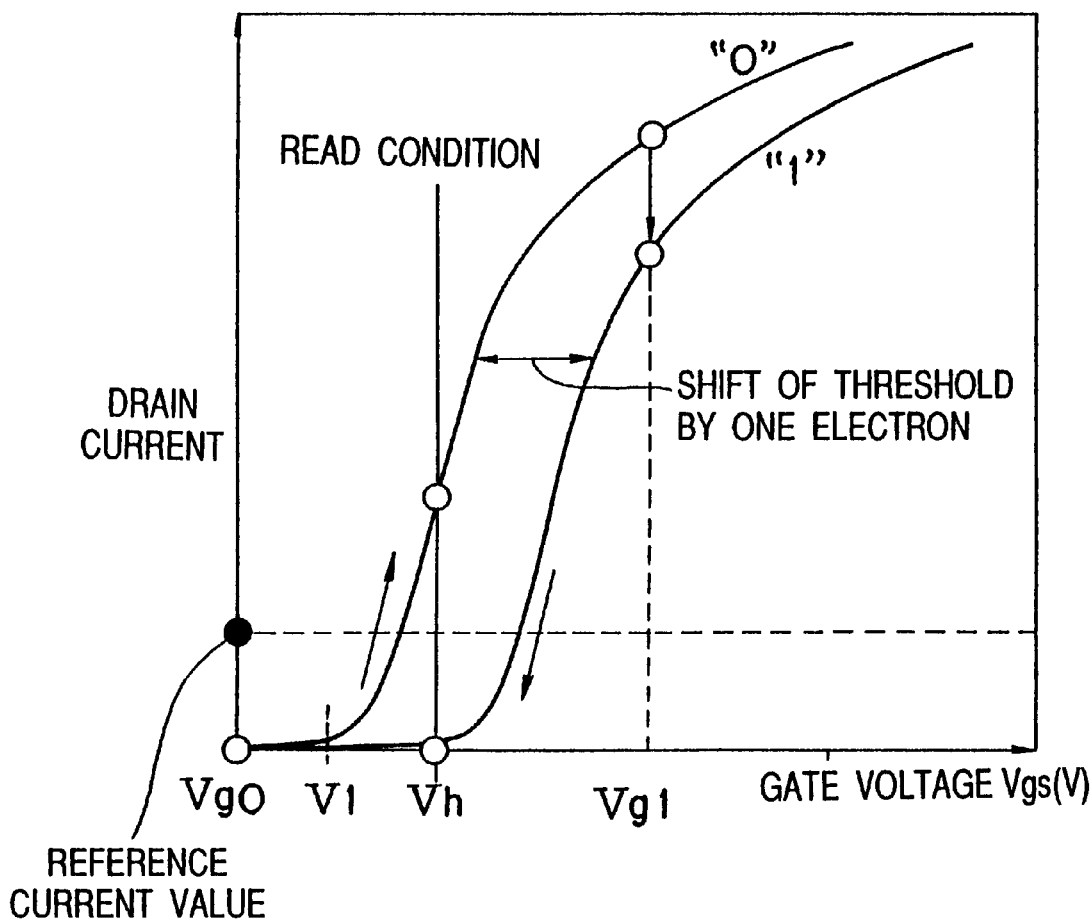

SEMICONDUCTOR STORAGE ELEMENT HAVING A CHANNEL REGION FORMED OF AN AGGREGATE OF SPHERICAL GRAINS AND A METHOD OF MANUFACTURING THE SAME

BACKGROUND OF THE INVENTION

The present invention relates to a semiconductor storage element and a method of manufacturing it.

In order to reduce the power consumption and the size of electronic equipments, there is a demand for a nonvolatile semiconductor storage element which consumes a small electric power and provides a high integration density. To achieve such a semiconductor storage element, the semiconductor storage element is required to be able to be constituted of a reduced number of components and in a small area. A known semiconductor storage device having a highest degree of integration is a DRAM (Dynamic Random Access Memory) whose memory cells each consist of one transistor and one capacitor. However, the efforts to further increase the degree of integration of the DRAM by simply reducing the size of the memory cells almost reach the limit. One reason for that is that it has become technically difficult to further pursue the fineness or smallness. Even if it is technically possible to do so, use of high techniques is required, so that the cost for manufacturing the DRAM becomes considerably high. Another reason is as follows. In the DRAM, information is stored by accumulating a charge in the capacitor. In order to reliably read a charge amount accumulated in the capacitor, it is necessary for the capacitor to have a certain capacity (several tens of fF/cell). Therefore, it is difficult to form the capacitor in a smaller area.

To overcome the problem, there are proposed the following semiconductor storage elements (1) and (2) each constituted of a small number of components and having an information storage function in a small area (Japanese Laid-Open Patent Publication No. 7-111295).

(1) A semiconductor storage element having a source region and a drain region, wherein the source region is connected with the drain region through a channel region; the channel region is connected with a gate electrode through a gate insulation film; a level for capturing at least one carrier is formed proximately to a current path of the channel region positioned between the source region and the drain region; and an effective capacity Cgc between the gate electrode and the channel region satisfies the following inequality:

$$1/Cgc > kT/q^2 \quad \text{equation (1)}$$

where k: Boltzmann's constant, T: operation temperature, and q: charge amount of electron (2) A semiconductor storage element having a source region and a drain region, wherein the source region is connected with the drain region through a channel region; the channel region is connected with a gate electrode through a gate insulation film; at least one carrier trap region is formed proximately to a current path of the channel region positioned between the source region and the drain region; a potential barrier is provided between the channel region and the carrier trap region; a capacity C between the channel region and the carrier trap region is set to be greater than a capacity Cgt between the gate electrode and the carrier trap region; and the whole capacity Ctt of the carrier trap region satisfies the following inequality:

$$q^2/(2Ctt) > kT \quad \text{equation (2)}$$

where k: Boltzmann's constant, T: operation temperature, and q: charge amount of electron FIG. 4 is a graph showing the dependence of a drain current on the voltage between the gate and the source in each of the semiconductor storage elements (1) and (2). As shown in FIG. 4, when a gate voltage Vgs is vertically swept between Vg0 and Vg1, the conductance between the source and the drain exhibits a hysteresis at the room temperature. That is, whether a carrier has been captured can be detected in terms of the magnitude of electric current. This indicates that a semiconductor storage device can be realized by controlling the semiconductor storage element (1) or (2) with a data line and a word line.

In the Japanese Laid-Open Patent Publication No. 7-111295, there are disclosed concrete examples of the semiconductor storage elements (1) and (2) which are shown in FIGS. 5A, 5B, 5C, and 5D and FIGS. 6A and 6B, respectively.

SEMICONDUCTOR STORAGE ELEMENT (1)

The semiconductor storage element (1) uses a thin polycrystalline silicon film for the channel region and has a construction shown in FIGS. 5A–5D. The semiconductor storage element is manufactured by the following method.

First, although not shown, an n-type channel MOS and a p-type channel MOS, namely, a CMOS device is formed on a P-type Si substrate, and then, an insulation film is formed on the CMOS device, and a metal wire is then formed. Thereafter, an interlayer insulation film is deposited. Then, the interlayer insulation film is flattened to reduce the degree of irregularity of a surface thereof. Then, as shown in FIGS. 5C and 5D, a polycrystalline silicon region which serves as a gate 104 of the semiconductor storage element is formed. The polycrystalline silicon region is doped with an n-type impurity at a high concentration to have a low resistance. Then, an SiO2 film having a thickness of about 50 nm, which is to be formed as a gate insulation film 105, is deposited by the CVD (chemical vapor deposition) method on the polycrystalline silicon region. Then, an amorphous silicon film which has a thickness of about 10 nm and is to be formed as a channel 103 is deposited on the gate insulation film 105. After the amorphous silicon film is patterned, an ion implantation of an n-type impurity such as arsenic (As), phosphorus (P) or the like is carried out at a source 101 and a drain 102, and then, the amorphous silicon film is annealed at about 750° C. to form the channel 103 of polycrystalline silicon. Then, a source contact portion 108 connected with the source 101 is formed, and a drain contact portion 109 connected with the drain 102 is formed. Thereafter, a protection film 110 of SiO2 is formed on the source 101, the drain 102, and the channel 103 to complete the formation of the semiconductor storage element. In FIG. 5C, the protection film 110 is not drawn.

In the crystallization made by annealing the amorphous silicon film at 750° C., the grains of silicon grow in the amorphous silicon. When the size of the grain becomes equal to the thickness of the film, it is impossible to accomplish the crystalline growth any longer in the direction perpendicular to the film surface and at the same time, the speed of the crystalline growth in the direction parallel with the film surface becomes slow. Thus, the size of the grain in the horizontal direction (direction in parallel with the film surface) becomes substantially equal to the film thickness. As shown in FIG. 5B, a feature of the semiconductor storage element is that the grains are very small, which contributes to reducing the capacity Cgc between the gate and the channel. That is, in the vicinity of a threshold, because electric current flows through the grains by transferring from one grain to another sequentially, an actual current path 106 shown in FIG. 5A is a part of the channel 103 and very narrow. Further, because the size of the grain is small and the current path 106 of the channel 103 is narrow, the effective capacity Cgc between the gate and the channel can be reduced so that it satisfies the equation (1).

The trap level 107 of a carrier trap region shown in FIGS. 5A and 5D is considered to be caused by a level of a grain (i.e., a grain of polycrystalline silicon) itself surrounded by a high barrier and a level at a grain boundary (i.e., a high energy region between adjacent grains).

SEMICONDUCTOR STORAGE ELEMENT (2)

The semiconductor storage element (2) uses an SOI (Semiconductor on Insulator) substrate as its substrate and has a construction shown in FIGS. 6A and 6B. The semiconductor storage element is manufactured by the following method.

Initially, an insulation film 202 is formed on a crystalline substrate 201. Then, using photoetching technique, a source 219, a drain 220, and a channel 221 are formed on the insulation film 202. The channel 221 is processed in narrow lines. The source 219 and the drain 220 are doped with an n-type impurity at a high concentration. The channel 221 is doped with an n-type impurity, an i-type impurity or a p-type impurity at a low concentration. Then, an insulation film 225 consisting of SiO2 is deposited by the CVD (chemical vapor deposition) method. Then, silicon grain 224 is formed by the CVD method. Thereafter, a gate insulation film 223 consisting of SiO2 is deposited by using the CVD method again. After a metal film is deposited thereon, a gate electrode 222 is formed by using photoetching technique. In order to make the radius of the silicon grain 224 serving as a storage region (carrier trap region) small, nuclei formed in the early stage of the CVD deposit formation are utilized for formation of the silicon grains. In the semiconductor storage element, the radius of the silicon grain 224 which is the storage region is small. Therefore, the whole capacity Ctt of the storage region is small, thus satisfying the equation (2).

However, each of the semiconductor storage elements (1) and (2) as constructed above has the following problems.

PROBLEMS OF SEMICONDUCTOR STORAGE ELEMENT (1)

Problems (a) and (b) are described in the following literature: K. YANO, et al., "Single-Electron-Memory Integrated Circuit for Giga-to-Tera Bit Storage" ISSCC96, DIGEST OF TECHNICAL PAPERS, p266 (1996)

(a) The data storage time of the semiconductor storage element (1) is as short as one day. Thus, it cannot be used as a nonvolatile memory. This is because an electron captured at a trap level of the channel region cannot stay forever but is released a day after it is captured. This is attributed to the fact that the potential barrier between the trap level and other regions is low.

(b) There is a large variation in characteristics (a threshold voltage, etc.) for the following reason. In the method of crystallizing amorphous silicon by heat-treating it after it is deposited, the density and positions of the crystalline nuclei are not controlled. Thus, it is impossible to make the grain diameters uniform and obtain crystallizability providing good grains and good grain boundaries.

PROBLEMS OF SEMICONDUCTOR STORAGE ELEMENT (2)

(c) The grain which is the carrier trap region is coated with the insulation film. Carriers are implanted in the carrier trap region through the insulation film. That is, electric current flows through the insulation film. Therefore, it takes a long time to write data, and the characteristic of the insulation film deteriorates. Thus, the number of repetitions of reloading or rewriting is limited and the range of applications of the element is limited.

(d) In the method of forming grains using nuclei formed in the early stage of the CVD deposit formation, the size and density of the nuclei cannot be controlled. Thus, there is a variation in the performance such as the data storage characteristic and the reloading characteristic.

SUMMARY OF THE INVENTION

Therefore, it is an object of the present invention to provide a nonvolatile semiconductor storage element which has little variation in characteristics and is repeatedly reloadable or rewritable at a high speed, and a method of manufacturing such a semiconductor storage element.

According to the present invention, there is provided a semiconductor storage element wherein a source region, a drain region, and a channel region connecting the source region with the drain region are each made of a semiconductor material and formed on an insulated substrate; the channel region contains an electrical path and a carrier trap region which is formed at a location other than the electric path; and an insulation film is formed between the channel region and a gate electrode, characterized in that the channel region is constituted of a grain aggregate consisting of spherical grains which are arranged two-dimensionally on the insulated substrate and connected with one another such that the adjacent spherical grains are conductive to one another.

Assuming that the volume of a spherical grain and that of a rectangular parallelopiped-shaped grain are equal to each other, the minimum energy of the former is lower than that of the latter. In the present invention, the grains of the channel region are not rectangular but spherical. Thus, a carrier trap level of the carrier trap region is low. Further, potential barriers between the carrier trap region (hereinafter also referred to as "capture region") and other regions include a potential barrier at an interface between a semiconductor film and an insulation film and a potential barrier at a grain boundary. For example, the potential barrier at an interface between a thin semiconductor film consisting of Si and an insulation film consisting of $SiO_2$ is as great as about 3 eV, whereas the potential barrier at the grain boundary is as low as about 1 eV. Accordingly, the stability of the captured carrier is determined by the potential barrier of the grain boundary. In the case of the spherical grains, because the area of contact between the adjacent grains is smaller than in the case of rectangular parallelopiped-shaped grains, the probability of movement of the carrier through the grain boundary is allowed to be smaller and the captured carrier can be kept more stably than in the case of the rectangular parallelopiped-shaped grains. In this manner, according to the present invention, the trap level in the capture region is lowered and the potential barrier between the capture region and other regions is increased, so that the probability of movement of the carrier is reduced. Thus, the captured carrier can be held in the carrier trap region for a sufficiently long time.

Accordingly, it is possible to realize a semiconductor storage element which is nonvolatile, has little variation in characteristics, and is repeatedly rewritable at a high speed. Further, it is possible to provide a nonvolatile semiconductor storage device superior in holding data-holding characteristic by arranging a plurality of the semiconductor storage elements of the present invention and controlling the semiconductor storage elements by a word line, a data line, etc.

If each of the spherical grains of the grain aggregate has a radius of 9 nm or less, the minimum energy of the grain is allowed to be greater than a fluctuation of the energy at a room temperature. Thus, the carrier capture or trap region operates effectively at the room temperature without being affected by the thermal fluctuation. It is unnecessary to cool the carrier capture region to a cryogeneric temperature.

According to the present invention, there is also provided a method of manufacturing a semiconductor storage element wherein a source region, a drain region, and a channel region connecting the source region with the drain region are each made of a semiconductor material and formed on an insulated substrate; the channel region contains an electrical path and a carrier trap region which is formed at a location other than the electric path; and an insulation film is formed between the channel region and a gate electrode, comprising the steps of:

depositing an amorphous semiconductor film on the insulated substrate at a deposition temperature and at a low pressure below an atmospheric pressure; and heat-treating the deposited amorphous semiconductor film at a temperature higher than the deposition temperature under vacuum or in an ambient of a nonoxidizing gas to form a grain aggregate as the channel region on the insulated substrate, the grain aggregate consisting of spherical grains which are arranged two-dimensionally on the insulated substrate and connected with one another such that the adjacent spherical grains are conductive to one another.

In this method, the grain aggregate constituting the channel region of the semiconductor storage element of the present invention is formed by changing the entirety of the deposited amorphous semiconductor film into the spherical grains.

In order to form the grains in the form of a sphere which is the most stable shape, it is important that when the crystals are grown by heat treatment of the amorphous semiconductor film, the surface the amorphous semiconductor film is free of an oxide film which inhibits the crystal growth, so that the shape of the grain surface can change easily. To this end, in an embodiment, after depositing the amorphous semiconductor film, the grain aggregate is formed without exposing the thin amorphous semiconductor film to the atmospheric air. On the other hand, when the amorphous semiconductor film is exposed to the atmospheric air, because an oxide film is formed on the surface of the amorphous semiconductor film, the oxide film is removed from the surface before forming the grain aggregate.

Preferably, the removal of the oxide film from the surface of the amorphous semiconductor film is performed at a temperature lower than the deposition temperature of the amorphous semiconductor film. This is because the method prevents the amorphous semiconductor film from being crystallized in removing the oxide film and the removal process does not adversely affect the formation of the grain aggregate which is made afterwards.

In an embodiment, after depositing the amorphous semiconductor film, crystalline nuclei are formed on the surface of the amorphous semiconductor film at a low pressure below the atmospheric pressure before forming the grain aggregate.

In this case, the grains are formed using the crystalline nuclei as seeds. Therefore, the controllability of the size of the grain, the shape thereof, and the crystallizability can be enhanced, so that variation of the characteristic is reduced.

In an embodiment, the step of forming crystalline nuclei is carried out under vacuum of less than 0.01 Torr using a gas containing one of monosilane gas, disilane gas, and trisilane gas as a source gas. The reason for formation of the crystalline nuclei under vacuum of less than 0.01 Torr is to prevent islandlike grains from being formed.

In an embodiment, the grains are grown using the crystalline nuclei as seeds without exposing the crystalline nuclei to an atmospheric air, under vacuum of less than 0.01 Torr and at a temperature which is higher than 550° C. and higher than a temperature at which the crystalline nuclei have been formed.

In this case, because the crystalline nuclei are not exposed to the atmospheric air, crystals grow without the crystalline nuclei being oxidized. Thus, the shape of the grain surface changes easily, so that the grains are formed into a spherical shape which is the most stable shape. Further, by using vacuum of less than 0.01 Torr and a temperature which is higher than 550° C. and higher than a temperature at which the crystalline nuclei have been formed, grains having a uniform size and shape can be formed.

By setting a film thickness t of the deposited amorphous semiconductor film and a radius r0 of the spherical grains of the grain aggregate such that a relationship of $t \geq (\pi/3) \times r0$ is satisfied, the grains of the grain aggregate are well connected with one another, and an electric conductive state among the grains is maintained. Therefore, a preferable current path can be insured in the channel region.

In an embodiment, an amorphous silicon film is deposited on the insulation substrate as the amorphous semiconductor film by using one of monosilane gas, disilane gas, and trisilane gas as a source gas or by using a mixture of a nonoxidizing gas (for example, helium gas, nitrogen gas, argon gas or hydrogen gas) and one of monosilane gas, disilane gas, and trisilane gas as a source gas and allowing the reaction of the source gas to occur at a low pressure below the atmospheric pressure, using, for example, a CVD device. Thereafter, the deposited amorphous silicon film is heat-treated under vacuum of less than 10 Torr or in an ambient of such as helium gas, nitrogen gas, argon gas or hydrogen gas having a pressure less than 10 Torr at a temperature higher than the deposition temperature of the amorphous silicon film. In this manner, the grain aggregate consisting of grains having a uniform size and shape is able to be formed with ease and good controllability. When the nonoxidizing gas such as helium gas, nitrogen gas, argon gas or hydrogen gas is used as a diluent gas in depositing the amorphous silicon film and/or forming the grain aggregate, the uniformity of the grains is controlled more easily.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 4 is a graph showing the dependence of the drain current on the voltage between a gate and a source in a conventional semiconductor storage element;

DETAILED DESCRIPTION OF THE PREFERRED EMBODIMENTS

The semiconductor storage element of the present invention and the method of manufacturing it will be described below by way of the embodiments shown in drawings.

<First Embodiment>

Figure 1A:
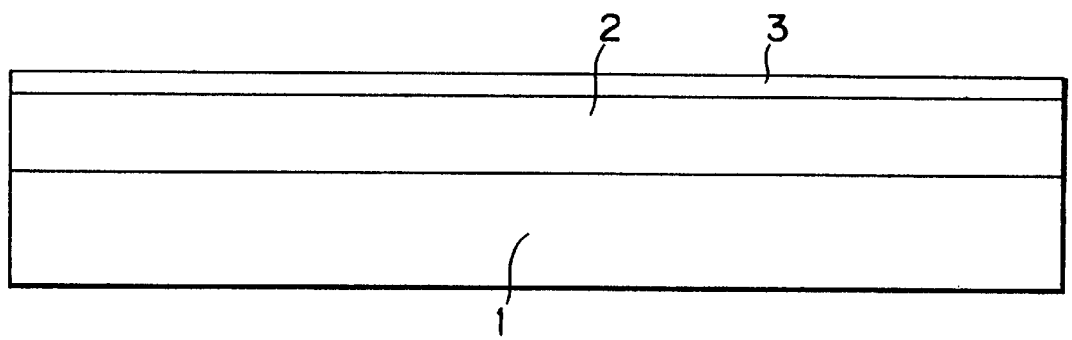
FIGS. 1A, 1B, and 1C are sectional views showing the process of manufacturing a semiconductor storage element of a first embodiment of the present invention.
Figure 1B:
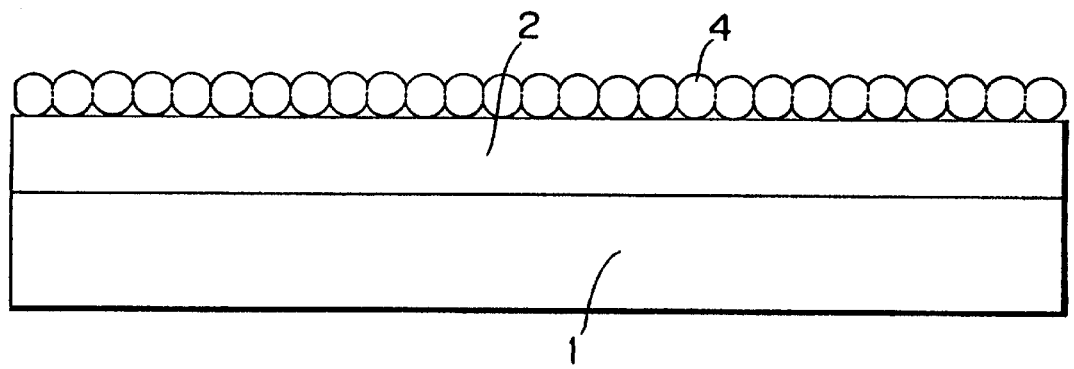
Figure 1C:
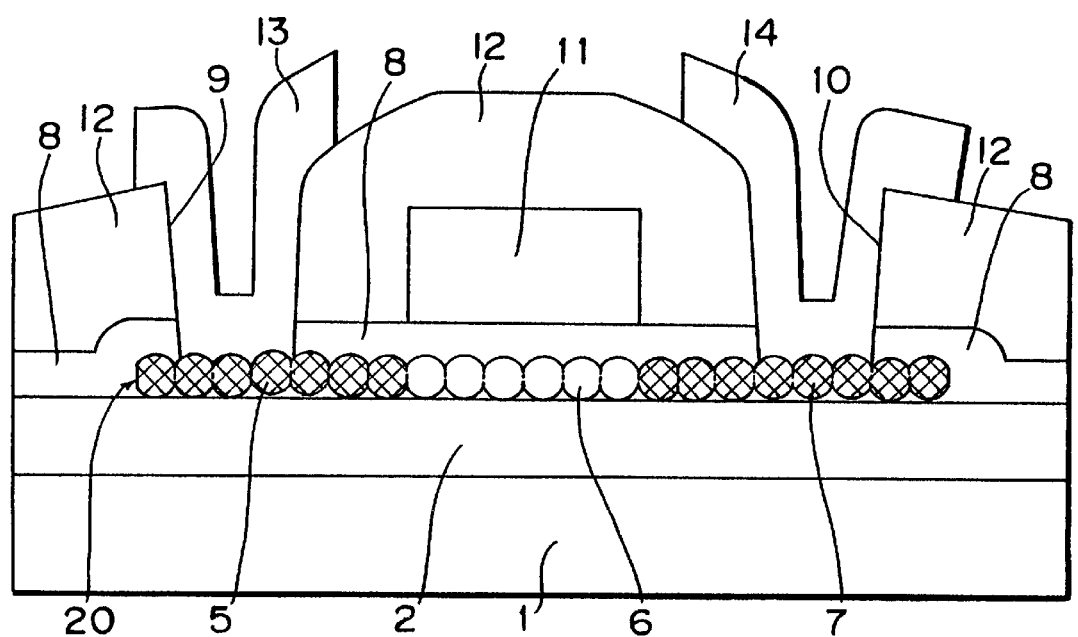

FIGS. 1A, 1B, and 1C show the process steps of manufacturing a semiconductor storage element of a first embodiment of the present invention.

First, as shown in FIG. 1A, an insulation film 2 is formed on a P-type silicon substrate 1 on which an n-type channel MOS (not shown) and a p-type channel MOS (not shown), namely, a CMOS device has been formed. Then, flattening treatment for reducing the degree of irregularity of a surface of the insulation film 2 is carried out. Then, an amorphous silicon thin film 3 is formed on the insulation film 2.

Then, as shown in FIG. 1B, the amorphous silicon thin film 3 is heat-treated to form a grain aggregate 4 of polycrystalline silicon consisting of spherical grains arranged two-dimensionally on the silicon substrate 1.

Then, after the grain aggregate 4 is obtained, a grain aggregate 20 is formed, as shown in FIG. 1C, by removing regions of the grain aggregate 4 other than a region which will serve as an active region. Then, an SiO2 film having a thickness of about 30 nm which is to be formed into a gate insulation film 8 is deposited by the CVD method. Then, a polycrystalline silicon region which serves as a gate electrode 11 is formed. In the polycrystalline silicon region, an n-type impurity is doped heavily, or at a high concentration to allow the polycrystalline silicon region to have a low resistance. After the polycrystalline silicon region is patterned, an ion implantation of an n-type impurity such as arsenic (As), phosphorus (P), and the like is carried out at opposite ends of the grain aggregate 20 to form a source region 5 and a drain region 7. A center part of the grain aggregate 20 serves as a channel region 6. Further, an interlayer insulation film 12 of SiO2 is formed on the gate insulation film 8 and the gate electrode 11. After contact holes 9 and 10 are formed, a source electrode 13 and a drain electrode 14 are formed on the contact holes 9 and 10, respectively. Finally, a protection film (not shown) is formed, and the formation of the semiconductor storage element is thus completed.

The method of forming the grain aggregate 4 is described below.

First, using a hot wall type LP (low pressure) CVD device (not shown) of a furnace type, a process of depositing the amorphous silicon thin film 3 in a thickness of 8 nm and a heat-treatment process for forming spherical grains are successively carried out in the CVD device in the following condition without destroying vacuum, namely, without exposing the substrate to the atmospheric air.

[Process of depositing an amorphous silicon thin film]
Deposition temperature: 500° C.
Source gas: monosilane 20 sccm
Diluent gas: helium 100 sccm
Pressure: 0.1 Torr
Deposition speed: 2 Å/min.

[Heat treatment process]
Temperature: 750° C.
Ambient gas: helium
Pressure: 0.01 Torr The spherical grain aggregate 4 consisting of grains each having a radius of about 8 nm is obtained under the above conditions.

Instead of monosilane, disilane gas or trisilane gas may be used as the source gas used in the [process of depositing an amorphous silicon thin film]. Because the monosilane gas, the disilane gas, and the trisilane gas are decomposed at temperatures lowered further in the order of the monosilane gas, the disilane gas, and the trisilane gas, the deposition temperature for each gas can be decreased in this order. Thus, the amorphous silicon thin film 3 is deposited in the temperature range of 500–550° C., 450–500° C., and 400–450° C. for each of the gases. Generally, if a film thickness of the amorphous silicon thin film 3 is as thin as 10 nm or less, the film 3 is liable to become island-like immediately after it is deposited. Thus, it is preferable to deposit the amorphous silicon thin film 3 at a lower temperature to obtain a continuous thin film required for the semiconductor storage element.

Further, although helium is used as the diluent gas in the first embodiment, a nonoxidizing gas such as nitrogen, hydrogen or argon may be used. In addition, although the diluent gas is not necessarily used, the uniformity of the grains can be controlled more easily by using the diluent gas.

Further, in order to allow the crystallization to proceed, it is necessary to set the temperature of the [heat treatment process] to a temperature higher than 500° C. which is the deposition temperature of the amorphous silicon thin film 3. It is preferable to set the temperature of [heat treatment process] to a temperature higher than 600° C. at which the crystallization proceeds easily. Generally, the density of the crystalline nuclei generated at the early stage of the heat treatment becomes increasingly high as temperature becomes higher. Thus, in the first embodiment, the temperature in the [heat treatment process] is set to 750° C. The pressure is set to 0.01 Torr in this example, because at a pressure of 10 Torr or higher, unpreferably, the grains do not become spherical or the sizes thereof are nonuniform. Generally, in order to obtain a desired spherical grain aggregate, it is necessary to select a temperature suitable for the property of the deposited amorphous silicon thin film 3. Further, use of an ambient of a little nonoxidizing gas during the heat treatment makes it easy to obtain the uniform grain aggregate 4 on the entire surface of the substrate.

When using an apparatus having a CVD reaction chamber and a lamp annealing or heat treatment oven through which the substrate is transportable via a load-locking chamber in a vacuum, the process of depositing the amorphous silicon thin film and the heat treatment process may be performed at separate reaction chambers.

Further, if the substrate is exposed to air after the amorphous silicon thin film 3 has been deposited thereon, an oxide film is formed on the surface of the amorphous silicon thin film 3. In such a case, a grain aggregate equivalent to that of the first embodiment can be obtained by removing the oxide film from the surface of the amorphous silicon thin film 3 by a method described below, and then by successively heat-treating the amorphous silicon thin film 3 for crystallization without exposing the substrate to the atmospheric air so as not to form an oxide film on the surface of the amorphous silicon thin film 3. That is, the substrate is successively treated under vacuum by using a so-called multi-chamber type apparatus having both an oxide film-removing reaction chamber and a heat treatment device through which the substrate is transportable in a vacuum via a load-locking chamber. The native oxide film may be removed by etching in an ambient of hydrofluoric acid (HF) vapor or by sputtering in an argon (Ar) plasma ambient.

Figure 2:
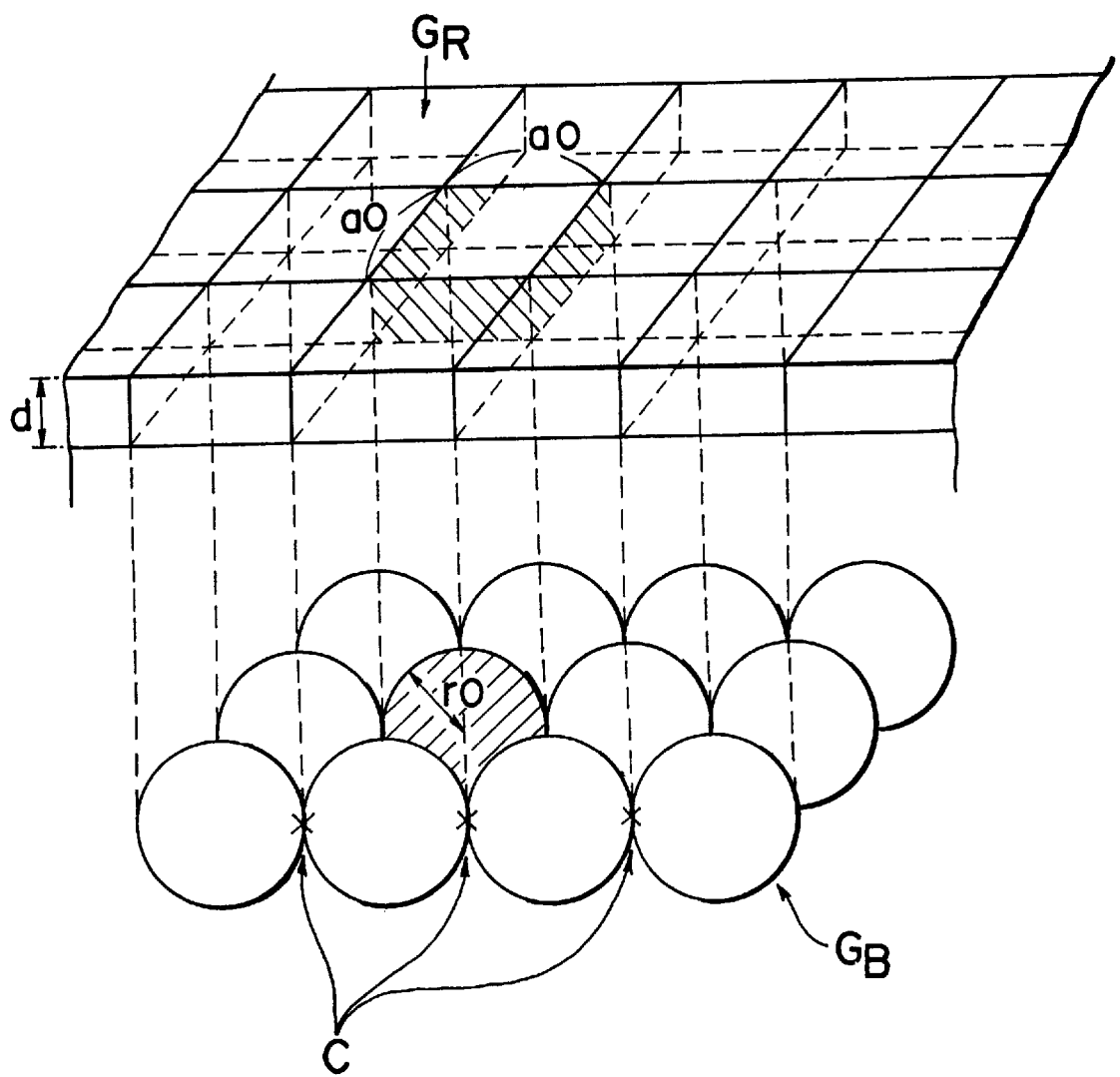
FIG. 2 is a schematic view showing spherical grains of the semiconductor storage element of the invention and rectangular parallelopiped-shaped grains of a conventional semiconductor element.

FIG. 2 is a schematic view showing spherical grains $G_B$ of the channel region 6 of the semiconductor storage element and rectangular parallelopiped-shaped grains $G_R$ of a conventional semiconductor thin film.

As shown in FIG. 2, in each of the grains $G_R$ of the very thin conventional semiconductor film, a trapping region consists of a rectangular parallelopiped whose one side is a0 and whose thickness is d, and is considered to be a well-type potential surrounded with potential barriers at grain boundaries (high energy regions between the adjacent grains) and at Si/SiO$_2$ interfaces. Supposing that the height of the well-type potential is infinite, a minimum energy E1 of an electron present therein is expressed as follows based on the general quantum mechanics:

$$E1 = h^2/(8m) \times (1/a0^2 + 1/a0^2 + 1/d^2) \quad \text{equation (3)}$$

(h: Planck's constant, m: effective mass of electron)
A minimum energy E2 of each of the spherical grains $G_B$, shown in FIG. 2, having a radius of r0 is expressed as follows:

$$E2 = h^2/(8m) \times (1/r0^2) \quad \text{equation (4)}$$

Let it be supposed that one side a0 of the rectangular parallelopiped is equal to the diameter 2r0 of the sphere and that the volume of the rectangular parallelopiped is equal to that of the sphere:

$$a0 = 2 \times r0$$

$$a0^2 \times d = (4/3) \times \pi \times r0^3$$

From the above, the thickness d of the rectangular parallelopiped is expressed as follows:

$$d = (\pi/3) \times r0 \quad \text{equation (5)}$$

The following equation is obtained by substituting the equation (5) in the equations (3) and (4):

$$E1 = 1.41 \times h^2/(8m) \times (1/r0^2) = 1.41 \times E2 > E2 \quad \text{equation (6)}$$

The equation (6) indicates that if the volume of the grain $G_R$ and that of the grain $G_B$ are equal to each other, the minimum energy of the sphere is lower than that of the rectangular parallelopiped. That is, the spherical grain $G_B$ prevents a captured carrier from escaping from a trap level to a greater extent than the rectangular grain $G_R$ does.

Further, in the above discussion, it is assumed that the height of the potential barrier between the trap or capture region and other regions is infinite in the semiconductor storage element, but actually it is finite, i.e., there exist a "potential barrier at an interface between a semiconductor thin film and an insulation film" and a "potential barrier at a grain boundary." The "potential barrier at an interface between the semiconductor thin film of Si and the insulation film of SiO$_2$" is as great as about 3 eV, whereas the "potential barrier at a grain boundary" is as low as about 1 eV. Accordingly, the stability of the captured carrier is determined by the "potential barrier at a grain boundary." The area of a contact portion C (shown by "X" in FIG. 2) at which spherical grains are electrically conductive to each other is smaller than the area of a contact portion at which the rectangular parallelopiped-shaped grains are electrically conductive to each other. Therefore, in the case of the spherical grains, the probability of movement of the carrier through the grain boundary is made smaller and the captured carrier is kept more stably than in the case of the rectangular parallelopiped-shaped grains.

Further, supposing that the grain is spherical, in order for the carrier trapping region to work effectively without being affected by a thermal fluctuation, it is necessary that the minimum energy E2 of the grain is greater than the fluctuation (kT) of energy. To this end, the following equation (7) should be satisfied:

$$E2 = (h^2/8m) \times (1/r0^2) > kT \quad \text{equation (7)}$$

Accordingly, the radius (r0) of the grain will be expressed as follows:

$$r0 < h/[8mkT]^{1/2} \quad \text{equation (8)}$$

In order to satisfy the equation (8) at the room temperature, the radius r0 of the grain is as follows:

$$r0 \leq 9 \text{ nm} \quad \text{equation (9)}$$

Considering the above, in the first embodiment, the radius r0 of the grain is set to 8 nm.

The writing/erasure operation of the semiconductor storage element having the above construction is performed as follows by controlling a gate voltage Vgs which is applied between the gate voltage 11 and the source electrode 13 shown in FIG. 1C.

First, while the gate voltage Vgs is 0V and the semiconductor storage element is in an erasure state "0" in which electrons are not captured in carrier trap regions in the channel region 6 of the semiconductor storage element, the channel region 6 forms a low energy well-type potential surrounded with a potential barrier at the grain boundary in the channel region 6a, and with the insulation film 2 and the gate insulation film 8 in the vicinity thereof. Because the energy of the carrier trap regions in the channel region 6 is much higher than the Fermi level of the source region 5, no electrons are present in the carrier trap regions. Further, the energy level of the conduction band of the channel region 6 is much higher than the energy level of the conduction band in the n-type source region 5 having a high impurity concentration or the degenerated Fermi level in the n-type source region 5 having a high impurity concentration. Thus, no electrons are present in the channel region 6 and hence, a drain current does not flow.

Then, if the gate voltage Vgs is increased from 0V for the erasure state "0" to a low threshold voltage V1, the electric potential of the channel region 6 rises, and the potential of the channel region 6 with respect to electrons drops, and thus electrons are introduced into the channel region 6 from the source region 5. Thus, the drain current flows between the source electrode 13 and the drain electrode 14.

If the gate voltage Vgs is increased further, the number of the electrons in the channel region 6 increases further. When the gate voltage Vgs has reached a write voltage Vg1 (5V), the energy of the carrier trap region in the channel region 6 drops. Due to the thermal energy distribution and tunnel phenomenon of the electrons, at least one electron passes through the potential barrier and is captured in the carrier trap region. As a result, the semiconductor storage element goes into a write state "1". In the write state "1", a coulomb blockade phenomenon occurs due to the electron captured in the carrier trap region, and the potential of the grains of the channel region 6 rises, which prevents more electrons from being implanted to the grains of the channel region 6.

If the gate voltage Vgs is decreased in a range of Vh<Vgs<Vg1 from the write state "1" in which at least one electron has been captured by the grains of the channel region 6, the number of electrons in the channel region 6 is reduced. But, since the potential barrier is still present in the grain boundary of the channel region 6, the electron or electrons captured in the carrier trap regions of the channel region 6 remain therein. When the gate voltage Vgs is dropped further to Vh, few electrons are present in the channel region 6 because the Fermi level of the source region 5 is distant by about kT from the energy level of the conduction band of the channel region 6. Accordingly, when the gate voltage Vgs is a high threshold voltage Vh, the drain current does not flow. The high threshold voltage Vh is higher than the low threshold voltage V1 by a voltage corresponding to an amount of a charge captured in the carrier trap regions in the channel region 6.

If the gate voltage Vgs is decreased further to a low voltage of, for example, 0V, the electrons captured in the carrier trap regions in the channel region 6 are emitted therefrom owing to the thermal energy distribution of the electrons and the tunneling caused by the field effect. As a result, the semiconductor storage element returns to the erasure state "0".

As described above, by sweeping the gate voltage Vgs between 0V and the write voltage Vg1, the write/erasure operation is repeated and the drain current displays hysteresis. Thus, the semiconductor storage element is capable of accurately detecting the magnitude of the drain current to determine whether or not the carrier or carriers have been captured.

As described above, because the semiconductor storage element has a channel region 6 including spherical grains arranged two-dimensionally on the silicon substrate 1, and because the channel region 6 is a part of an aggregate 20 of grains which are connected with one another so that they are conductive to one another, it is possible to lower the trap level in the carrier trapping region and to reduce the probability of movement of the carrier between the trapping region and other regions. This allows the captured carrier to be held in the trapping region for a sufficiently long time. Accordingly, it is possible to provide the semiconductor storage element in which stored data is nonvolatile, few variations occur in characteristics, and data can be repeatedly reloaded at a high speed. Further, using the semiconductor storage elements of the present invention, it is possible to provide a nonvolatile semiconductor storage device having a good data-holding characteristic.

Figure 3:
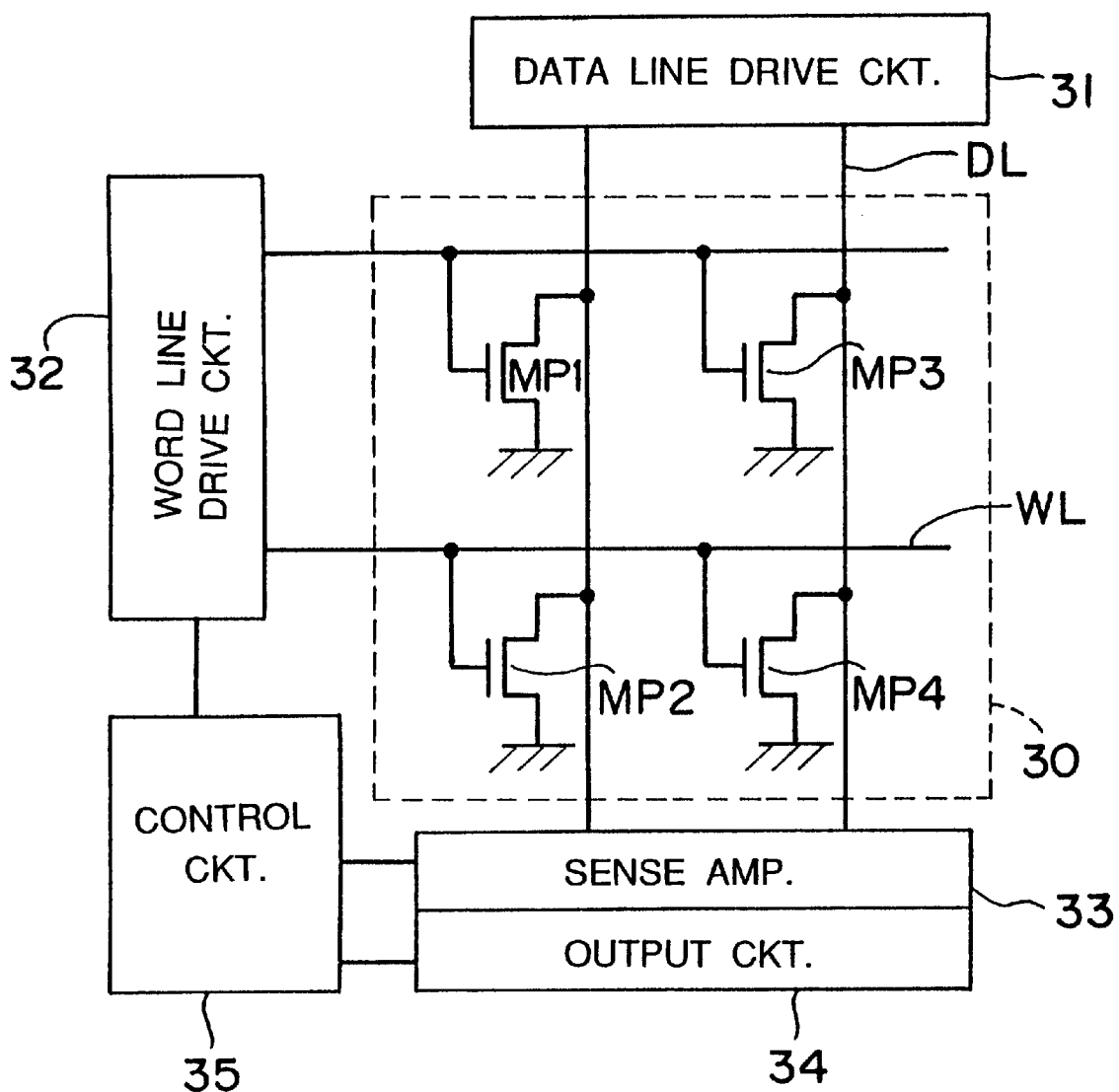
FIG. 3 shows the construction of a storage device using the semiconductor storage elements of the first embodiment.
Figure 5A:
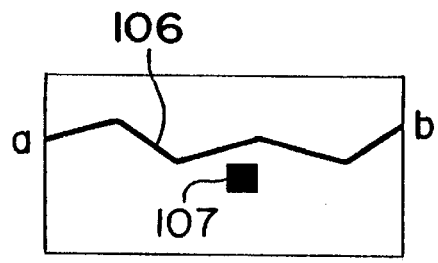
FIG. 5A is a schematic view showing an electric current path and a trap level in a channel of a conventional semiconductor storage element.
Figure 5B:
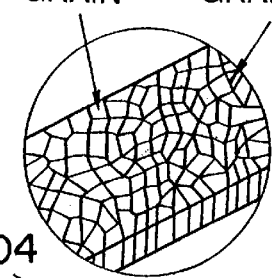
FIG. 5B is an enlarged view showing the channel of the conventional semiconductor storage element.
Figure 5C:
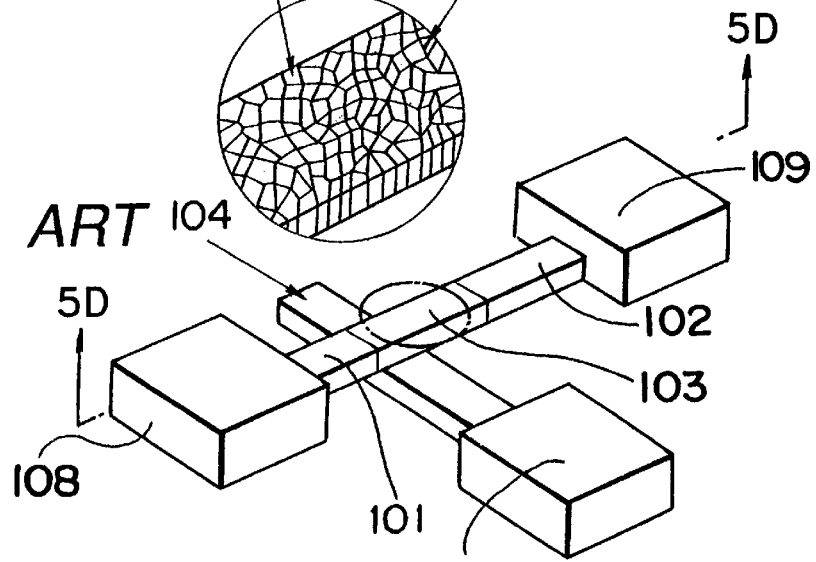
FIG. 5C is a perspective view of the conventional semiconductor storage element.
Figure 5D:
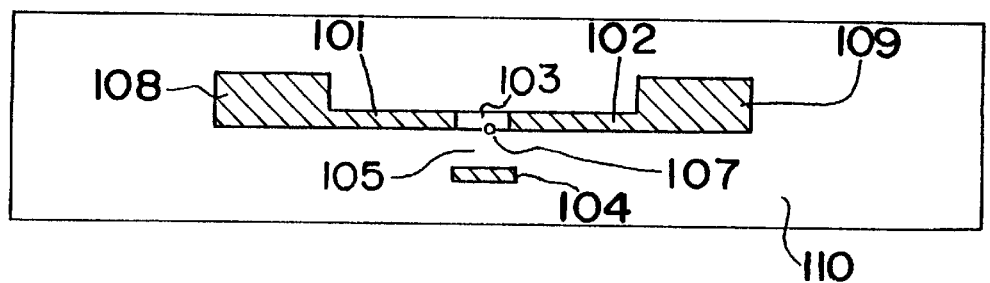
FIG. 5D is a sectional view taken along the line D—D of FIG. 5C.
Figure 6A:
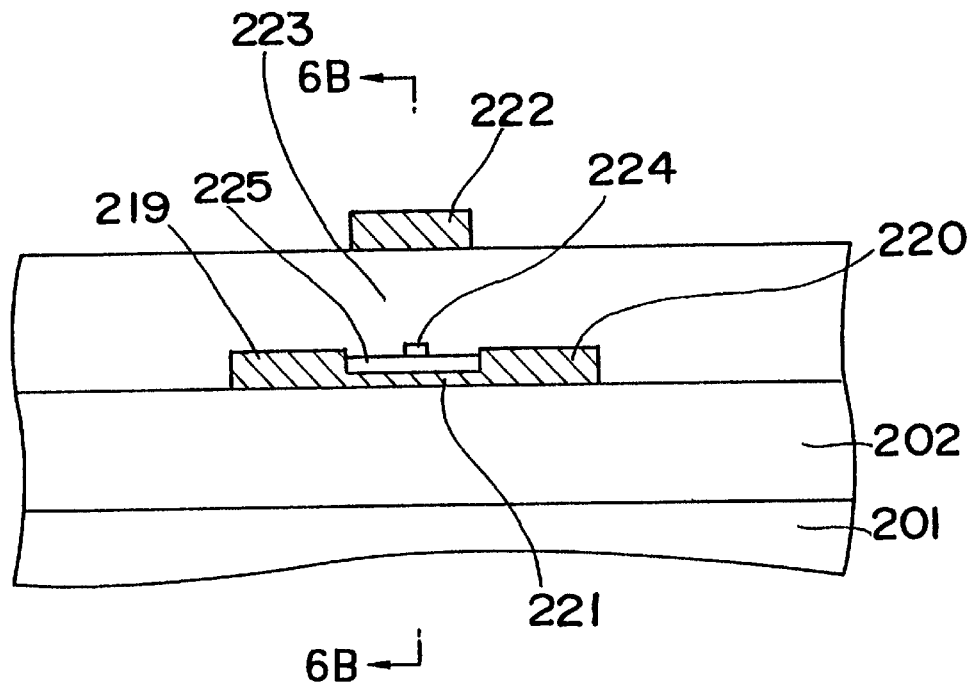
FIG. 6A is a sectional view of another conventional semiconductor storage element.
Figure 6B:
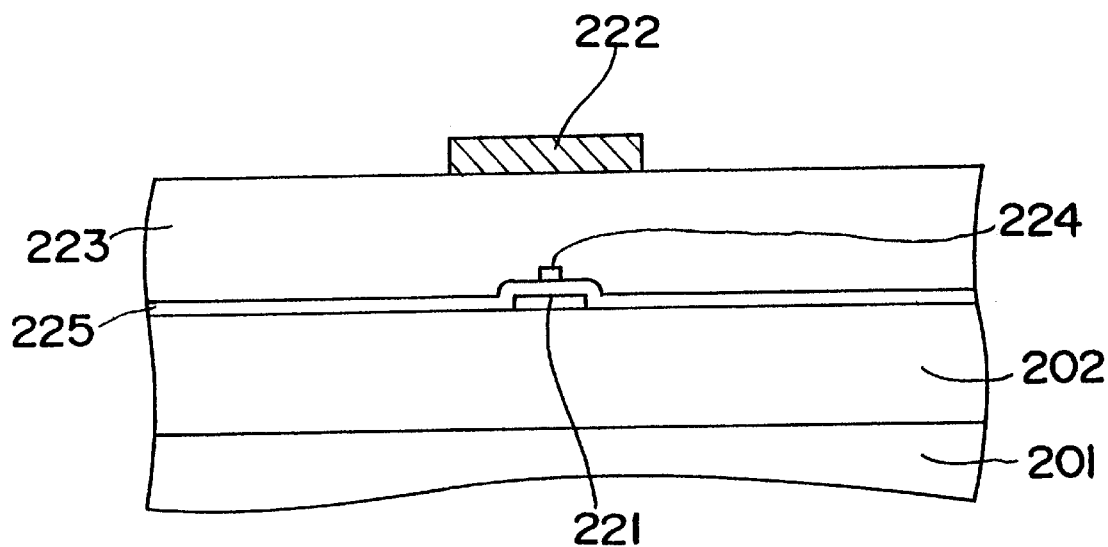
FIG. 6B is a sectional view taken along the line B—B of FIG. 6A.

For example, in a semiconductor storage device shown in FIG. 3, there is formed on a substrate a cell array 30 wherein semiconductor storage elements MP1–MP4 of the invention are arranged; word lines WL are connected with gates of the semiconductor storage elements MP1–MP4; data lines DL are connected with drains of the semiconductor storage elements MP1–MP4; and sources thereof are connected with the ground. Below the cell array 30, there are formed a data line drive circuit 31, a word line drive circuit 32, a sense amplifier 33, an output circuit 34, and a control circuit 35. Under the control of the control circuit 35, the word lines WL are driven by the word line drive circuit 32 and the data lines DL are driven by the data line drive circuit 31 so that data stored by the semiconductor storage elements MP1–MP4 are read through the sense amplifier 33 and the output circuit 34.

Further, according to the present embodiment, by forming the spherical grain into a radius of 9 nm or less (8 nm in the first embodiment), the minimum energy of the grain becomes greater than the fluctuation of the energy at the room temperature. Thus, the carrier trapping region operates effectively without being affected by a thermal fluctuation.

After depositing the amorphous silicon thin film 3 on the insulation film 2, the grain aggregate 4 is formed succeedingly without exposing the amorphous silicon thin film 3 to the atmospheric air. Because the surface of the crystallized thin silicon film is not formed with a native oxide film which hinders the crystal growth, the configuration of the grain surface changes easily. Thus, grains can be formed in the form of a sphere which is the most stable shape.

By setting the deposited film thickness t of the amorphous silicon thin film 3 and the radius r0 of the grain such that the relationship of $t \geq (\pi/3) \times r0$ is satisfied, the grains of the grain aggregate 4 are connected with one another, and an electric conductive state among the grains is maintained. Therefore, a preferable current path is ensured in the channel region 6.

Using a mixture of a silane gas and a nonoxidizing helium gas as a source gas, the reaction of both gases is allowed to occur at a low pressure below the atmospheric pressure to deposit the amorphous silicon thin film 3 on the silicon substrate 1. Then, the amorphous silicon thin film 3 is heat-treated at a temperature higher than the deposition temperature of the amorphous silicon thin film 3 in an ambient of the nonoxidizing helium gas having a pressure of 0.01 Torr. By thus doing, a grain aggregate consisting of grains having a uniform size and shape is able to be formed easily and with a good controllability. If the nonoxidizing helium gas is used as a diluent gas in depositing the amorphous silicon thin film and/or forming the grain aggregate, the uniformity of the grains is controllable more easily.

Further, if the deposited amorphous silicon thin film 3 is exposed to the atmospheric air, an oxide film formed on the surface of the amorphous silicon thin film 3 due to the exposure is removed by sputtering in an argon (Ar) plasma or by reducing the oxide in an ambient of silane gas or the like under a high vacuum to crystallize the amorphous silicon thin film 3 in the state in which the oxide film has been removed therefrom. Because the oxide film which inhibits the crystal growth has been removed from the surface of the amorphous silicon thin film 3 and thus the shape of the surface of the grain changes easily, the grain can be formed in the most stable shape of a sphere.

Further, the removal of the oxide film formed on the surface of the amorphous silicon thin film 3 is performed at a temperature lower than the temperature at which the amorphous silicon thin film 3 is deposited. This prevents the amorphous silicon thin film 3 from being crystallized during the oxide film removal process, so that the oxide film removal process does not adversely affect the formation of the grain aggregate 4 which is made afterwards.

<Second Embodiment>

A method of manufacturing a semiconductor storage element of a second embodiment of the present invention will be described below.

Initially, an amorphous silicon thin film having a thickness of 8 nm is deposited in a manner similar to that of the first embodiment. Then, under the conditions described below, a surface of the amorphous silicon thin film is pretreated with hydrofluoric acid (HF), and using the same apparatus as in the first embodiment, crystalline nuclei are formed on the surface of the amorphous silicon thin film. Then, the amorphous silicon thin film is heat-treated for crystallization without being exposed to the atmospheric air to thereby form a spherical-grain aggregate.

[Pre-treating process]

Hydrofluoric acid (HF): 1%

Duration: one minute

[Process of forming crystalline nuclei]

After the vacuum of $1 \times 10^{-9}$ is drawn:

Temperature: 590° C.

Pressure: $1 \times 10^{-5}$ Torr

Disilane gas: 10 sccm

Duration: 12 minutes

[Heat treatment process]

Temperature: 740° C.

Pressure: $1 \times 10^{-9}$ Torr

Duration: 60 seconds

An aggregate of spherical grains having a radius of about 8 nm satisfying the equations (5) and (9) was obtained under the above conditions. In a manner similar to the first embodiment, the semiconductor storage element shown in FIG. 1 is formed.

During the formation of the crystalline nuclei (during irradiation of disilane gas), crystal growth does not occur. The density of crystalline nuclei increases as the temperature becomes higher and the disilane gas is irradiated for a longer time. Further, the grain becomes increasingly great as the heat treatment time for crystallization becomes longer. Accordingly, it is possible to form an aggregate of grains having a desired spherical shape by controlling the silane gas irradiation temperature, the silane gas irradiation time, and the heat treatment time.

In consideration of the controllability of the formation of the crystalline nuclei, a temperature range of 450–620° C. is preferable. The crystalline nuclei may be formed by irradiating monosilane gas or trisilane gas instead of disilane gas. It is not appropriate to set the pressure to higher than 0.01 Torr because silicon grains would be formed in an islandlike manner in such a high pressure.

The temperature of [heat treatment process] for the crystallization is set to 550° C. or higher, that is, to a temperature equal to or higher than the temperature at which the crystalline nuclei are formed. In the second embodiment, the temperature of [heat treatment process] for the crystallization is set to 740° C. Crystallization does not occur at a temperature below 550° C.

The thus formed semiconductor storage element has operations and effects similar to those of the semiconductor storage element of the first embodiment. Further, because the grains are formed using as seeds the crystalline nuclei formed on the surface of the amorphous silicon thin film, the controllability in crystallizing the amorphous silicon thin film and sizing and shaping the grains is enhanced, and the variation in characteristics is thus reduced.

Further, after the thin amorphous semiconductor film is deposited, it is heat-treated by using the disilane gas as the source gas so that molecules of the disilane gas or reaction seeds are adsorbed to the surface of the thin amorphous semiconductor film. In this manner, the crystalline nuclei are easily formed. Further, the formation of islandlike silicon grains is prevented by heat-treating the thin amorphous semiconductor film in vacuum of $1 \times 10^{-5}$ Torr.

Furthermore, because the crystalline nuclei are not exposed to the atmospheric air so that the crystal growth is effected in the state in which the crystalline nuclei are not oxidized, the shape of the surface of each grain changes easily. As a result, the grains are formed in the form of a sphere which is the most stable shape. Further, because the grains are grown by using the crystalline nuclei as seeds in a vacuum of $1 \times 10^{-9}$ Torr and at a temperature of 740° C., the spherical grains are formed in a uniform size and shape.

The above has described semiconductor storage elements using an amorphous silicon thin film as the amorphous semiconductor film and the method of manufacturing the semiconductor elements, in connection with the first and second embodiments of the invention. But needless to say, the amorphous semiconductor film is not limited to the amorphous silicon thin film.

Further, the above has described the semiconductor storage element in which the grain aggregate 20 forms the source region 5, the drain region 6, and the channel region 6, in connection with the first and second embodiments of the invention. But the grain aggregate of spherical grains may form the channel region only.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage element wherein a source region, a drain region, and a channel region connecting said source region with said drain region are each made of a semiconductor material and formed on an insulated substrate; said channel region contains an electrical path and a carrier trap region which is formed at a location other than said electric path; and an insulation film is formed between said channel region and a gate electrode, characterized in that:

said channel region is constituted of a grain aggregate consisting of spherical grains which are arranged two-dimensionally on said insulated substrate and connected with one another such that the adjacent spherical grains are conductive to one another.

2. The semiconductor storage element according to claim 1, wherein each of said grains of said grain aggregate has a radius of 9 nm or less.

3. The semiconductor storage element according to claim 1, wherein said grain aggregate constitutes said source and drain regions as well.

* * * * *

UNITED STATES PATENT AND TRADEMARK OFFICE
CERTIFICATE OF CORRECTION

PATENT NO. : 6,013,922
DATED : January 11, 2000
INVENTOR(S) : Ueda et al.

It is certified that error appears in the above-identified patent and that said letters patent is hereby corrected as shown below:

On the cover page, please insert the following:
-- [30] Foreign Application Priority Data
   30 May 1997      [JP]    Japan ........................... 9-141643--

Under [56] References Cited, please insert the following:
-- FOREIGN PATENT DOCUMENTS
A-7-111295    4/1995    Japan
   OTHER PUBLICATIONS
ISSCC96, DIGEST OF TECHNICAL PAPERS (1996), "Single-Electron-Memory Integrated Circuit for Giga-to-Tera Bit Storage" --

Signed and Sealed this

Twenty-eighth Day of November, 2000

Attest:

Q. TODD DICKINSON

*Attesting Officer*    *Director of Patents and Trademarks*